United States Patent [19]

Yuan et al.

[11] Patent Number: 5,070,032

[45] Date of Patent: Dec. 3, 1991

[54] METHOD OF MAKING DENSE FLASH EEPROM SEMICONDUCTOR MEMORY STRUCTURES

[75] Inventors: Jack H. Yuan, Cupertino; Eliyahou Harari, Los Gatos, both of Calif.

[73] Assignee: SunDisk Corporation, Santa Clara, Calif.

[21] Appl. No.: 323,779

[22] Filed: Mar. 15, 1989

[51] Int. Cl.$^5$ ............................................. H01L 21/265
[52] U.S. Cl. ........................................ 437/43; 437/49; 437/52; 437/233
[58] Field of Search ................ 437/43, 52, 195, 968, 437/983, 193; 357/23.5

[56] References Cited

U.S. PATENT DOCUMENTS

| | | | |
|---|---|---|---|
| 4,239,559 | 12/1980 | Ito ........................................ | 437/968 |
| 4,804,637 | 2/1989 | Smayling et al. ....................... | 437/43 |
| 4,814,286 | 3/1989 | Tam ....................................... | 437/43 |
| 4,852,062 | 7/1989 | Baker et al. ........................... | 365/185 |
| 4,853,895 | 8/1989 | Mitchell et al. ....................... | 437/43 |

FOREIGN PATENT DOCUMENTS 349774  1/1990 European Pat. Off. .
0003976 1/1984 Japan .

OTHER PUBLICATIONS

Mizutani and Makita, "A New EPROM Cell with a Side-wall Floating Gate for High-Density and High-Performance Device", *IDEM 85*, pp. 635–639, 1985.

*Primary Examiner*—Brian E. Hearn
*Assistant Examiner*—Chandra Chaudhari
*Attorney, Agent, or Firm*—Majestic, Parsons, Siebert & Hsue

[57] ABSTRACT

An improved electrically erasable and programmable read only memory (EEprom) structure and processes of making it which results in a denser integrated circuit, improved operation and extended lifetime. In order to eliminate certain ill effects resulting from tolerances which must be allowed for registration of masks used in successive steps in forming the semiconductor structures, spacers are formed with reference to the position of existing elements in order to form floating gates and define small areas of these gates where, in a controlled fashion, a tunnel erase dielectric is formed. Alternatively, a polysilicon strip conductor is separated into separate control gates by a series of etching steps that includes an anisotropic etch of boundary oxide layers to define the area of the control gates that are coupled to the erase gate through an erase dielectric. In either case, the polysilicon layer strip can alternatively be separated by growing oxide thereon until it is completely consumed. A technique for forming a pure oxide dielectric layer of uniform thickness includes depositing a thin layer of an undoped polysilicon material and then oxidizing its surface until substantially the entire undoped polysilicon layer is consumed and made part of the resulting oxide layer. Overlapping doped regions are provided in the substrate by an ion implantation mask that adds spacers to the mask aperture to change its size between implants.

30 Claims, 6 Drawing Sheets

METHOD OF MAKING DENSE FLASH EEPROM SEMICONDUCTOR MEMORY STRUCTURES

BACKGROUND OF THE INVENTION

This invention relates generally to semiconductor electrically erasable programmable read only memories (EEprom), and specifically to semiconductor structures of such memories and processes of making them.

An electrically programmable read only memory (Eprom) utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate. The transistor is programmed to one of two states by accelerating electrons from the substrate channel region, through a thin gate dielectric and onto the floating gate.

The memory cell transistor's state is read by placing an operating voltage across its source and drain and on its control gate, and then detecting the level of current flowing between the source and drain. The level of current tells whether the device is programmed to be "on" or "off" at the control gate voltage selected. A specific, single cell in a two-dimensional array of Eprom cells is addressed for reading by application of a source-drain voltage to source and drain lines in a column containing the cell being addressed, and application of a control gate voltage to the control gates in a row containing the cell being addressed.

Early Eprom devices were erasable by exposure to ultraviolet light. More recently, the transistor cells have been made to be electrically erasable, and thus termed an electrically erasable and programmable read only memory (EEprom). Early EEprom cells were electrically erased by transfer of charge from the floating gate to the transistor drain through a very thin tunnel dielectric. This is accomplished by application of appropriate voltages to the transistor's source, drain and control gate. More recently, EEprom memory cells are provided with a separate, third gate for accomplishing the erasing. An erase gate passes through each memory cell transistor closely adjacent to a surface of the floating gate but insulated therefrom by a thin tunnel dielectric. Charge is then removed from the floating gate of a cell to the erase gate, when appropriate voltages are applied to all the transistor elements. An array of such EEprom cells are generally referred to as a Flash EEprom array because an entire array of cells, or significant group of cells, is erased simultaneously (i.e., in a flash).

Copending patent application Ser. No. 204,175 of Dr. Eliyahou Harari, filed June 8, 1988, contains a detailed discussion, with citations to the literature, of the prior art development of Eprom and EEprom devices in a section entitled "Detailed Description of the Prior Art," with respect to its FIGS. 1-4.

It is a primary object of the present invention to provide EEprom cell and array structures and processes for making them that result in cells of reduced size so their density on a semiconductor chip can be increased.

It is also an object of the invention that the structures be highly manufacturable, reliable, scalable, repeatable and reproducible with a very high yield.

It is yet another object of the present invention to provide EEprom semiconductor chips that are useful as a solid state memory that can replace magnetic disk storage devices.

Another object of the present invention is to provide a process with an increased insensitivity to misalignment of masks used to manufacture the semiconductor devices.

Further, it is an object of the present invention to provide an EEprom structure capable of an increased number of program/read cycles that it can endure.

Additionally, it is an object of the present invention to provide an EEprom structure with a fast response to programming and/or erasing.

Another object of the invention is to provide improved semiconductor processing techniques and structures.

SUMMARY OF THE INVENTION

These and additional objects are accomplished by the various aspects of the present invention, the principal features of which will be briefly and generally summarized.

According to one aspect, opposing edges of control gates are used as a positional reference to define (mask) regions of the semiconductor structure between the control gates that are subjected to processing, such as by etching, deposition, implantation, oxide growth, and the like. A primary application is to define a region of underlying conductive strips that are removed in order to separate the strips into isolated floating gates. This region of the semiconductor structure is defined by at least one spacer of a controlled width being formed adjacent a control gate edge and extending partway toward an opposing control gate edge.

In a preferred form, a pair of spacers are formed on opposing edges of adjacent control gates to define a region in the middle for such processing. A preferred way of forming such spacers is to deposit a thick oxide layer over the semiconductor substrate and then remove it by reactive ion etching in a manner that leaves spacers adjacent the vertical edges of the control gate. The spacer width is controlled by the parameters of the etching and can be made to be very precise.

A primary advantage of this technique is that it is insensitive to the relative alignment of masks used in subsequent processing steps. Without having to allow for the tolerance of mask misalignment that occurs in every semiconductor process, the resulting memory circuit can be made with small dimensions and thus the density of memory cells on an integrated circuit can be increased.

An alternative technique for separating polysilicon strips into individual memory cell floating gates, according to another aspect of the present invention, is to open an aperture, in a photoresist or other type of mask, between two cells and remove a covering oxide layer and the polysilicon under it by an anisotropic etch. Following that, an isotropic etch for a controlled amount of time removes oxide from above and below edges of the separated polysilicon floating gates to expose a controlled area for subsequent growing of an erase dielectric layer thereover, followed by deposition of an erase gate over the erase dielectric. This is an alternative technique that allows carefully defining the coupling area between the floating and erase gates in a manner that is reproducible.

With either of the techniques summarized above for masking the portion of the polysilicon strips to be removed in order to separate them into individual floating gates, an alternative to etching the polysilicon may be employed. According to a further aspect of the present invention, an oxide layer is grown on exposed portions of the polysilicon strips between the memory cells until the exposed polysilicon is completely consumed. This separates the polysilicon strips into floating gates of the adjacent memory cells. The floating gates are separated by a region that has been converted into a dielectric by oxidation, rather than by removing the polysilicon material through etching.

A further aspect of the present invention involves forming the floating gate somewhat differently than the control and erase gates, even though they all may be doped polysilicon material that is deposited by a chemical vapor deposition process. If the floating gate is so formed at a temperature of more than about 600-620 degrees Centigrade, its surface can be more effectively roughened by oxidation, to provide desired asperities in it, during the subsequent step of forming the erase dielectric over it. The surface asperities are desirable in order that the erase dielectric exhibit tunnel conduction of electrons through it from the floating gate to the erase gate during an erase cycle. It is desirable that the control and erase gates, on the other hand, be able to grow the highest quality dielectric with the lowest possible conduction through it. Therefore, the control and erase gates are preferably formed by the deposition process operating below 600-620 degrees Centigrade.

According to yet another aspect of the present invention, briefly and generally, an oxide layer of substantially uniform thickness is grown on a wafer being processed over exposed surfaces of material characterized by a significant differential rate of growth of oxide thereover. An example is a combination of exposed surfaces of lightly doped silicon and a doped polysilicon conductor, wherein oxide forms on the polysilicon at a higher rate than on the lightly doped silicon surface, often several times as fast, which results in an oxide layer being significantly thicker over the polysilicon than over the silicon. This is undesirable in certain applications. According to this invention, a uniform thickness layer of oxide is grown by first depositing over the exposed surfaces a layer of undoped polysilicon and then growing oxide over it until the polysilicon layer is substantially consumed by the oxidation process.

This oxidation technique has significant applications in the process of making Eprom and EEprom devices. One application is in forming the control gate oxide which extends over an oxide layer, previously formed directly on the semiconductor substrate surface, and polysilicon floating gate. Another application is in forming the erase gate oxide layer. A significant additional advantage of this technique in these applications is that a much purer oxide layer is formed over a doped polysilicon layer. When an oxide layer is grown directly over doped polysilicon in the usual manner, impurities are diffused into the grown oxide from the dopant in the underlying polysilicon. Since the intermediate polysilicon layer is undoped and the doped polysilicon layer is not oxidized, these impurities are substantially eliminated. The purer oxide layers, particularly the erase gate oxide, has a significant effect in extending the life of an EEprom in terms of the number of program/erase cycles it can endure before the number of electrons trapped in the oxide reach a level to render the EEprom substantially inoperable.

Yet another aspect of the present invention is a process for forming adjacent regions in the substrate surface which are ion implanted with dopants of opposite polarities. For example, in the EEprom devices described herein, a p-doped region is formed adjacent an n-doped source/drain region, both by ion implantation. Typically, both are currently implanted through a single opening in a mask and an inherent differential lateral diffusion is relied upon to position the p-doped region outside of and adjacent to the n-doped region. The process of the present invention, however, utilizes a spacer formed along at least one edge of the mask aperture during implantation of one polarity, with it being removed during implantation of the other polarity, in order to provide more control on the relative lateral positions of the two regions. The spacer protects the surface of the semiconductor substrate implanted with impurities of the first polarity type from overcompensation from the subsequent second implant of the opposite polarity.

Additional objects, features, and advantages of the various aspects of the present invention will become apparent from the following description of its preferred embodiments, which description should be taken in conjunction with the accompanying drawings.

DESCRIPTION OF THE PREFERRED EMBODIMENTS

Figure 1:
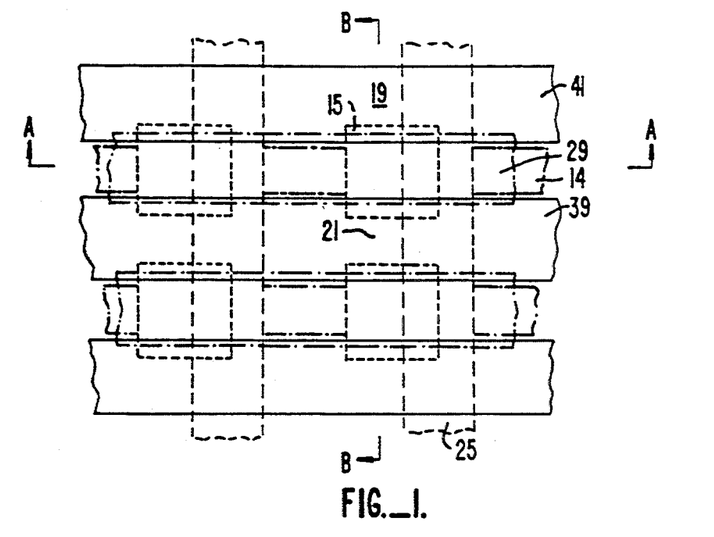
FIG. 1 is a schematic representation of an enlarged plan view of a plurality of electrically erasable and programmable read only memory cells formed on a semiconductor substrate in which the techniques of the present invention are utilized.
Figure 2A:
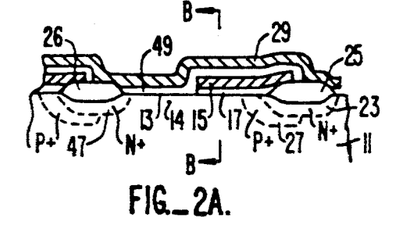
FIG. 2A is a cross-sectional view of the memory array of FIG. 1, taken at section A—A thereof.
Figure 2B:
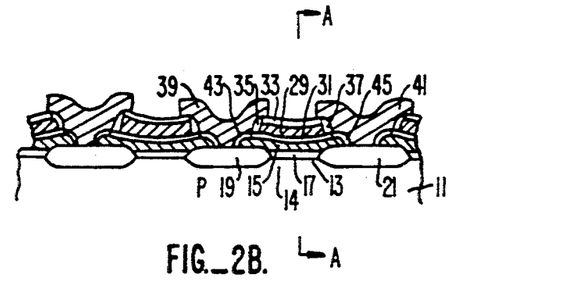
FIG. 2B is a cross-sectional view of the memory array of FIG. 1, taken at section B—B thereof.

Referring initially to FIGS. 1, 2A, and 2B, principal elements of a completed multi-cell EEprom integrated circuit structure will be described. A substrate 11 is lightly p-doped and has individual memory cells formed on its surface 13. The structure of a single cell will be described since they are all the same. An electrically conductive, rectalinearly shaped floating gate 15, preferably made of polysilicon material, is formed on the substrate surface 13 on top of a thin, high-quality gate oxide 17 therebetween. Field oxide strips 19 and 21 isolate this cell from all others in the same column and from those in other columns.

Source/drain diffusions 23, 47 are formed under thick oxide strips 25, 26. Regions 23, 47 are heavily n-doped. An adjacent region 27 of relatively heavy p-doping is provided under the floating gate 15, extending from the source/drain diffusion 23.

An elongated control gate 29 passes across the floating gate 15 and is separated therefrom by a thin dielectric layer 31. On top of the control gate 29 is a thicker insulation layer 33, and insulating spacers 35 and 37 are provided along the edges of the control gate 29. Elongated erase gates 39 and 41 are insulated from the floating gate 15 by dielectric layers 43 and 45. The erase gates 39 and 41, and the control gate 29, are preferably made of a polysilicon conductive material, or a silicide or other refractory metal.

With reference primarily to FIG. 2, it can be seen that the EEprom example being described is of a split-channel type. That is, the floating gate 15 extends only partway across the channel 14 between the source/drain diffusion 23 and an adjacent source/drain diffusion 47. In a remaining portion of the channel 14, the control gate 29 is coupled to the substrate surface 13 through a thin gate oxide 49.

Use of Spacers To Form Floating Gates

Figure 3A:
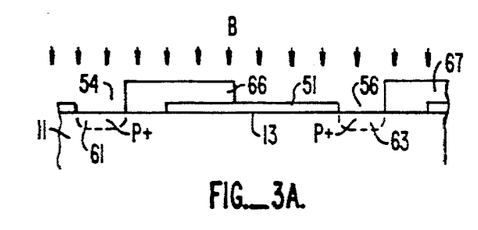
FIGS. 3A, 4A, 5A, 6A, and 7A show in cross-sectional view several initial processing steps in the formation of the memory device of FIG. 1, as viewed through section A—A thereof.
Figure 3B:
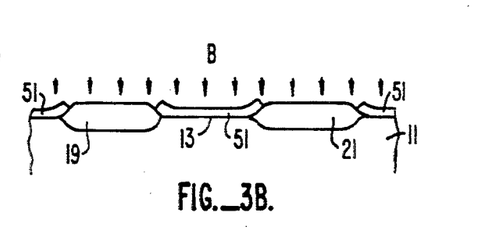
FIGS. 3B, 4B, 5B, 6B, and 7B show in cross-sectional view several initial processing steps in the formation of the memory device of FIG. 1, corresponding respectively to the views of FIGS. 3A, 4A, 5A, 6A, and 7A, but viewed through section B—B of FIG. 1.

An example process of forming the EEprom array illustrated in FIGS. 1, 2A and 2B, starts with an intermediate step illustrated in the sectional views of FIGS. 3A and 3B. FIG. 3A shows a stage of the construction of the device of FIGS. 1, 2A and 2B, across section A—A while the corresponding FIG. 3B shows the same stage of construction of the device as viewed across section B—B of FIG. 1. At the intermediate stage shown in FIGS. 3A and 3B, a nitride layer 51 has been formed on the surface 13 of semiconductor substrate 11 by ordinary techniques. Also by ordinary techniques, elongated, parallel openings 53 and 55 (FIG. 4A) have been formed in the nitride mask 51. Those openings have been restricted by photoresist portions 66 and 67, to leave openings 54 and 56. The elongated field oxide strips 19 and 21 have also been grown at this initial stage in the processing.

The step being performed in the illustration of FIGS. 3A and 3B is ion implantation with boron in order to form relatively heavily p-doped regions 61 and 63 coincident with the apertures 54 and 56, respectively. This is an initial series of steps in applying a standard DMOS process.

Figure 4A:
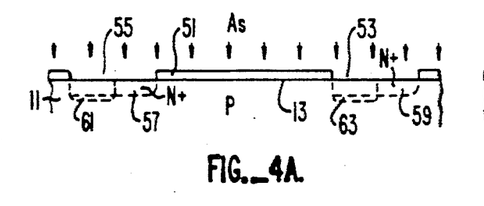
Figure 4B:
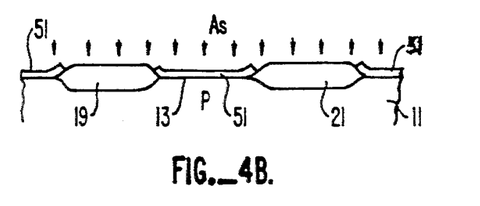

A next step, illustrated in FIGS. 4A and 4B, is to form heavily n-doped regions 57 and 59 in the substrate 11. The photoresist mask portions 66 and 67 are first removed in order to again open up apertures 53 and 55 in the nitride mask 51. Regions 57 and 59 are formed by ion implantation with arsenic.

Figure 5A:
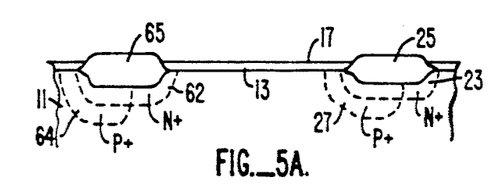

A next step is to form thick oxide strips 25 and 65 by growing them over the diffusion strips, as illustrated in FIG. 5A. This thick oxide provides good insulation in the completed memory cell between the diffused regions and conductive gates that are formed later. It also allows etching to take place in subsequent steps without endangering the substrate.

Figure 5B:
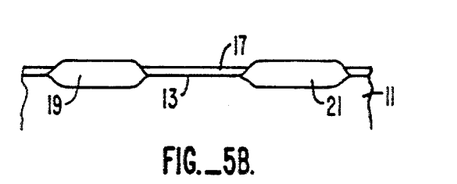

Since this standard oxidation technique involves high temperatures, the implanted regions are diffused downward and laterally within the substrate 11, resulting in the enlarged heavily n-doped source/drain regions 23 and 62, and p-doped region 27, as an example in one cell, with lateral dimensions that are controllable. The diffusion rate of the p-dopant is higher than that of the n-dopant, resulting in relatively heavily p-doped regions 27 and 64 that extend laterally and in depth beyond the n-doped regions 23 and 62. The nitride mask layer 17 is then stripped off the wafer. As a next step, shown in FIGS. 5A and 5B, a thin, high-quality layer 17 of gate oxide is grown over the surface 13 of the semiconductor wafer 11.

Figure 6A:
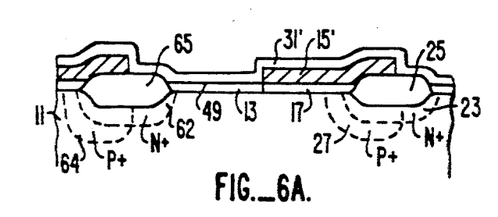
Figure 6B:
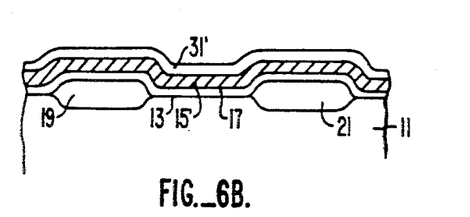

A next step, illustrated in FIGS. 6A and 6B, is to form equally spaced conductive polysilicon strips, including strip 15', which extends parallel to the diffusion strips and strips of oxide 25 and 65. A high quality layer 31' of oxide is then grown over the entire wafer, a portion of which serves as the dielectric layer 31 between the floating and control gates.

Figure 7A:
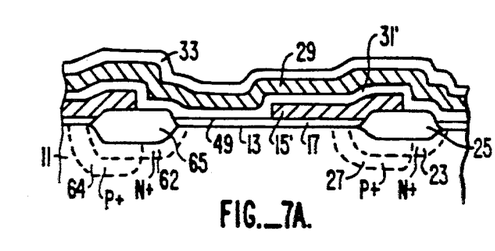
Figure 7B:
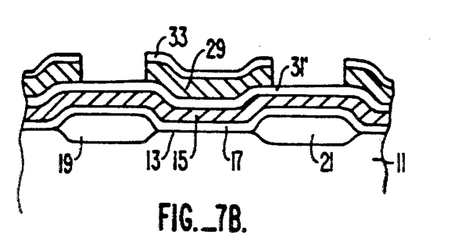

A next step, illustrated in FIGS. 7A and 7B, is the formation of elongated, parallel strips of conductive polysilicon material to serve as the control gates for the memory cells. Control gate 29 is one of these. The elongated control gate strips are parallel to each other and oriented perpendicularly to the strips 15' which will be processed to form the individual floating gates, discussed below. The control gates are formed with a thick oxide layer 33 deposited over them.

The process steps described so far will be recognized as a rather straight forward implementation of standard techniques which use a series of photographic masks to form protective masks on the wafer substrate surface in a pattern recorded on the photographic mask. Some process, such as etching, ion implantation or the like, is then accomplished through openings in the mask so formed on the wafer. Photoresist material is commonly used by coating it onto the wafer and exposing to the light pattern of the photographic mask. The photoresist volume that is exposed to light has a different solubility than the surrounding, unexposed volume, allowing a portion to be differentially removed by washing in an appropriate solution.

A problem always exists in aligning photographic masks so that the sequential steps build on one another in the proper way. Very sophisticated techniques have been developed for registering each new photographic mask to the pattern previously formed on the semiconductor wafer by use of prior photographic masks. However, there is a limit as to how accurately such registration can be accomplished. As semiconductor devices become more dense, the resolution requirements for patterns used in forming them have increased greatly, to the point where the ability to register subsequent photographic masks with each other is a limitation as to how close various parts of semiconductor structure being formed can be placed. Therefore, the process being described has been carefully designed in order to obtain a very high resolution structure that is not limited by tolerances inherent in current mask alignment techniques.

As an example of what has been described previously, the relatively heavy p-doped region 27 in the substrate is formed to be an active area for electron transfer to the floating gate 15. The threshold voltage that can be programmed into the cell is thus not so dependent upon the alignment of the floating gate 15 with respect to its source/drain diffusion 23. That is, the amount of the channel region between adjacent source/drain regions 23 and 62 that is covered by the floating gate 15 is not so critical as it is when the enhanced region 27 is not utilized. The width of the region 27 at the wafer surface 13 is controlled by lateral diffusion after ion implantation in accordance with FIG. 3A. The amount of lateral diffusion can be carefully controlled so that the alignment of the mask used to form the photoresist strips 66 and 67 in FIG. 3A is not highly critical to the resultant forming the lateral extent of the p-doped region 27 which affects the operation of the device.

Figure 8:
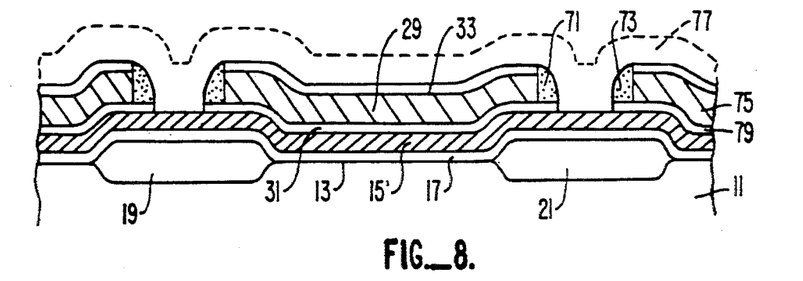
FIGS. 8-12 illustrate later processing steps in forming the memory device of FIG. 1, through section B—B thereof.

A next major processing step after that described with respect to FIGS. 7A and 7B is illustrated in FIG. 8, a section taken through B—B of FIG. 1. The steps illustrated in FIG. 8 have a goal of forming spacers along opposing edges of parallel control gates, such as the spacers 71 and 73 formed along opposing edges of adjacent control gate strips 29 and 75. The spacers are formed by depositing a thick layer 77 of undoped silicon dioxide over the entire chip, and then removing most of it by a dry reactive ion etching process. This process etches layer 77 in a vertical direction only, thereby leaving the spacers 71 and 73. The spacers are formed in a region of the layer 77 against the edges of the control gates 29 and 75 where the layer 77 is thicker than elsewhere. The dry etch is continued for a time to result in the spacers having a desired width. This width can be controlled very precisely by this process At the same time, the portion of the oxide layer 31' between the spacers will be removed, thereby leaving the oxide layer 31 and oxide layer 79 under the adjacent control gates 29 and 75. The etch is stopped before the oxide layers 33 on top of the control gates are reduced below their desired thickness.

A next step is to densify the spacers by raising the temperature of the wafer in excess of 800° C. A second pair of spacers 81 and 83 (FIG. 9) is then formed in a similar manner. A layer 85 of phosphorous-doped or boron-phosphorous-doped silicon dioxide is deposited over the entire wafer and then removed by a dry reactive ion etch with parameters selected to leave the second spacers 81 and 83 with a desired width. As mentioned previously, this process is capable of forming such spacers with a desired width, within a very few percent.

Figure 9:
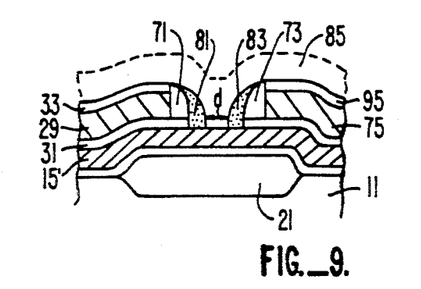
Figure 10:
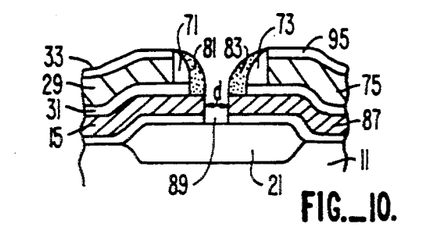

The purpose of the double spacers is to form a gap between them, indicated by the distance "d", as an opening for etching through the elongated polysilicon strip 15' in order to separate it into individual, isolated floating gates, such as the adjacent gates 15 and 87 shown in FIG. 10. The spacers serve as a mask to protect the edges of the desired floating gates from attack by the etching process. An appropriate reactive ion etch or plasma etch may be used to form a gap 89 between adjacent floating gates It will be noted that this gap has been formed without reliance upon alignment of successive photographic masks. The distance between opposing edges of adjacent control gates, such as control gates 29 and 75, are fixed by the photographic mask used to form those polysilicon strips. By using opposing edges of the control gates as a reference from which to define the gap "d" to be formed in the underlying floating gate strip 15', the tolerance that must be allowed for misalignment of successive photographic masks is not a limitation as to how small the distance "d" can be made. As a result, the individual EEprom memory cells are packed closer together in the dimension illustrated in FIGS. 8-12.

In order to provide an exposed surface on adjacent edges of each of the floating gates 15 and 87 that may be coupled to an erase gate, the most recently formed spacers, such as spacers 81 and 83, are removed by an appropriate wet etch. Because the first set of spacers 71 and 73, and all other exposed oxide, was densified prior to forming the second spacers 81 and 83, the spacers 81 and 83 will be etched at a much higher rate than any of the other exposed oxide. Indeed, the doped oxide spacers 81 and 83 are typically etched at a rate that is at least 50-100 times faster than that of the densified undoped oxide.

Figure 11:
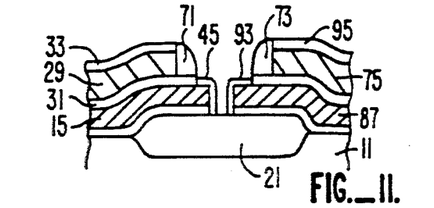

As shown in FIG. 11, opposing edges of adjacent floating gates 15 and 87 have erase gate oxide layers 45 and 93 grown over them. Indeed, the process grows such a layer over most of the integrated circuit chip but it is important only in the areas indicated at 45 and 93. Additionally, the oxide is grown at a much faster rate over the polysilicon material of the floating gates 15 and 87 than it is over the exposed oxide that exists in most of the remaining portion of the wafer.

Figure 12:
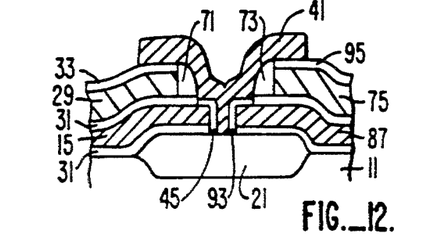

As indicated in FIG. 12, the erase gate 41 is formed, either from a metal such a aluminum or polysilicon, in a manner where the erase oxide layers 45 and 93 separate the erase gate 41 from adjacent floating gates 15 and 87.

The techniques described above represent an improved way of self-aligning the floating and control gates of the EEprom embodiment illustrated in FIGS. 8a and 8b of the aforementioned patent application Ser. No. 204,175. A significant advantage of this process is that the erase oxide layers 45 and 93 are formed independent of any other operation. That is, the erase oxide is not formed as part of the same layer as some other oxide, such as that between the floating and control gates, as in other processes. As a result, the coupling between the floating and erase gates can be optimized. A tunneling dielectric layer is preferred and it is made very thin, which results in a lower voltage needing to be applied across the erase oxide layers when the floating gates are being erased. This has the advantage of prolonging the number of erase cycles that can be accomplished before the erase oxide begins to deteriorate. It also shortens the time necessary to accomplish a full erase. The process also allows forming asperities on the exposed portions of the floating gates by oxidation followed by etching without affecting other surface portions of the floating gates, before forming the oxide layers 45 and 93, thereby to further enhance the erase characteristics of the device without introducing undesired side effects.

Figure 13:
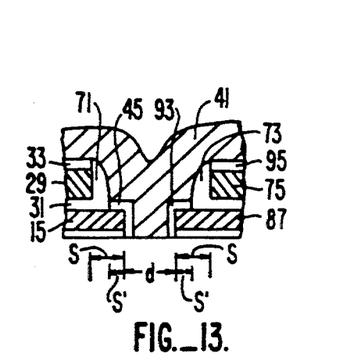
FIG. 13 is an enlarged view of completed adjacent memory cells of the memory circuit of FIG. 1, taken across section B—B thereof.

Referring to FIG. 13, some dimensions are indicated. The amount of area of each floating gate 15 and 87 that is coupled to their common erase gate 41 includes the vertical edges of the floating gate and the surface area having a dimension S'. The dimension S' is controlled primarily by the width of the second spacers 81 and 83 used in the process. The process assures that the coupling with each floating gate and its associated erase gate is substantially the same, a coupling that is controlled by the distance S', the thickness and composition of the erase dielectric layers 45 and 93, and the surface roughness of the floating gate. The distance S is controlled by the sum of the widths of the two spacers utilized. It is desired that the thickness of the spacers 71 and 73 be sufficient to result in little or no coupling between adjacent control gates 29 and 75 and the erase gate 41. Similarly, oxide layers 33 and 95 are maintained thick enough for the same desired isolation.

The structure of FIG. 2B implies that erase gates 39, 41 are provided at the two erase dielectric regions 43, 45 of each floating gate 15. However, it is possible to have only one of the two regions of erase dielectric covered by an erase gate.

Figure 14:
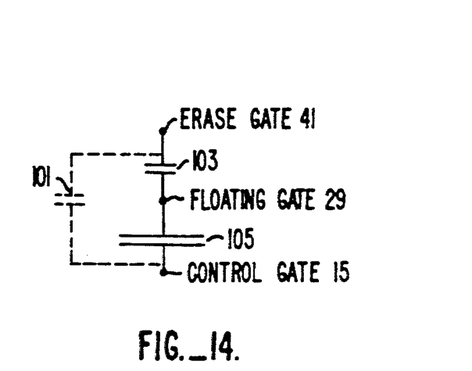
FIG. 14 illustrates an equivalent electrical circuit of a single memory cell formed in accordance with the techniques of FIGS. 1-13.

FIG. 14 is an equivalent circuit that generally illustrates the coupling between the three conductive gates of a single EEprom cell. A capacitance 101 shown in dotted outline indicates practically no coupling between the erase gate 41 and the control gate 15. These elements are uncoupled, as explained above, by the spacer 71 and thick oxide layer 33 on top of the control gate 29. Coupling between the erase gate 41 and floating gate 29 is indicated as a relatively small capacitance 103. The coupling between the floating gate 29 and the control gate 15, on the other hand, is indicated by a relatively large capacitance 105. The capacitances 103 and 105 are controlled primarily by the thickness of the dielectric between the elements and the extent of the common area between the adjacent gate elements.

The advantages of controlling the coupling in this manner can be explained with respect to FIG. 14 for an erase cycle, where a voltage such as 20 volts is placed on the erase gate and the control gate is held at ground potential. The combination of the relatively close coupling between the control gate and floating gate (indicated by the large capacitance 105) and the relatively low degree of coupling between the erase gate and floating gate (indicated by the small capacitance 103) causes the floating gate to be held close in voltage to the control gate. That results in a large voltage difference between the erase gate and floating gate, and thus a strong electric field that tends to move electrons from the floating gate to the erase gate. A significant advantage of this is that the floating gate can be erased more easily and quickly. It even allows reducing the erase gate voltage, which then increases the life of the device and makes the design of surrounding circuits easier.

When a cell is being programmed, the voltages are reversed, the control gate being held at about 12 volts, the erase gate is held at 0 volts, the drain at 8 volts and the source is held at ground potential. Because of the close coupling between the floating and control gates, the voltage on the control gate more significantly enhances the injection of electrons onto the floating gate from the device substrate. The low degree of coupling between the erase and floating gates reduces the undesirable interaction between those two elements during a programming cycle.

The doped polysilicon layers are preferably formed by a chemical vapor deposition process. Since it is important that the edges of the floating gate interface with the erase gates be roughened to leave asperities in their surfaces, the floating gates must be formed in a manner that allows such roughening to be accomplished during the formation of the erase dielectric layer. It is much easier to do so if the floating gates are deposited by a low pressure chemical vapor deposition process at a deposition temperature in excess of 600°–620° C. By doing so at this high temperature, the formation of asperities during the subsequent oxidation to grow the erase oxide is greatly enhanced, resulting in an erase dielectric which exhibits greatly enhanced tunnel conduction during erase of the floating gates. In order to allow formation of the highest quality (i.e. lowest conduction) oxide layer on the control and erase gates, formation of asperities should be suppressed on their surfaces. To achieve this condition concurrent with the enhanced conductivity of the erase oxide, those gates are formed by a chemical vapor deposition process at a deposition temperature of less than 600° C.

Process of Forming Thin Oxide Layers

As can be seen from FIG. 7A, the oxide layer 31' is grown over surfaces of different materials. One material is the lightly doped silicon substrate layer 13, and the other material is heavily doped polysilicon layer 15'. As is well known, the rate of growth of oxide on such heavily doped polysilicon is much higher, in a range of from 1.5 to 5 times as high, as that grown over the lightly doped silicon 13. Therefore, it can be difficult to make the oxide layer 31' thin enough over the polysilicon strip 15' in order to serve as a good gate oxide layer between the floating and control gates, without resulting in the gate oxide 49 between the control gate and the substrate from being thinner than desired.

Also, it is desired that the oxide layers grown over the doped polysilicon conductive material be as high a quality as possible. Some of the dopant within the polysilicon material, typically phosphorus, is retained in an oxide layer grown over the polysilicon during the usual thermal oxidation techniques. This impurity is undesirable in many of the thin oxides so grown, particularly for the erase oxides, such as the layers 45 and 93, which are grown over the edges of floating gates, such as the floating gates 15 and 87. It is believed that these impurities contribute to trapping electrons in the erase oxide layers over time, thus significantly contributing to the existing limitation of the number of program/erase cycles through which a memory cell may be put before it can no longer be effectively erased.

In order to overcome the foregoing disadvantages of directly growing an oxide layer over undoped as well as doped polysilicon conductive layers, a thin layer of undoped polysilicon is first deposited and then oxide grown thereover at a relatively low temperature (between 800°–900° C.) until substantially the entire undoped polysilicon material layer has been consumed and made part of the grown oxide layer. This technique results in a uniform thickness of oxide being formed over both lightly doped and heavily doped polysilicon surfaces, and is significantly purer since the doped polysilicon material is not made part of the oxidation process.

Figure 15:
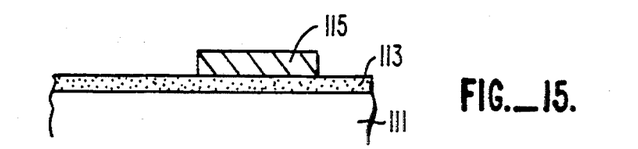
FIGS. 15-18 show sequential processing steps employed in an alternative technique for growing a layer of oxide.
Figure 16:
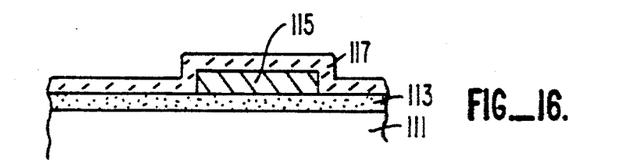

Referring to FIG. 15, this technique is illustrated for a semiconductor wafer 111 having a thin oxide layer 113 thereover and a phosphorus doped polysilicon layer 115 over a portion of the oxide layer's 113 surface. FIG. 16 shows a layer 117 of undoped polysilicon having been deposited by a chemical vapor deposition process with an uniform thickness over both the oxide and polysilicon layers. This thickness depends upon the desired ultimate thickness of the oxide layer.

Figure 17:
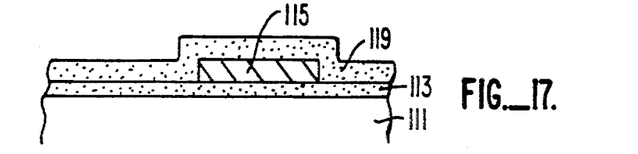

A next step, shown in FIG. 17, is to form an oxide layer over the undoped polysilicon layer 117 until, as a result, substantially the entire amount of undoped polysilicon has been consumed. An oxide layer 119 is the result, having a thickness that is greater than that of the undoped polysilicon layer 117 by a known amount. An additional step that may be desired in certain circumstances is to first grow a very thin layer of barrier oxide over the initially exposed surfaces of FIG. 15 before the undoped polysilicon layer 117 (FIG. 16) is deposited over it. This assures that the phosphorus or other impurities in the polysilicon layer 115 will not end up in the oxide layer 119 because the oxidation proceeds beyond the point that all of the undoped polysilicon layer 117 is consumed. If the oxidation does proceed too far, without such a barrier layer, a low level of impurities in the doped polysilicon layer 115 can become part of the oxide layer as the polysilicon 115 is consumed by the oxidation process.

Figure 18:
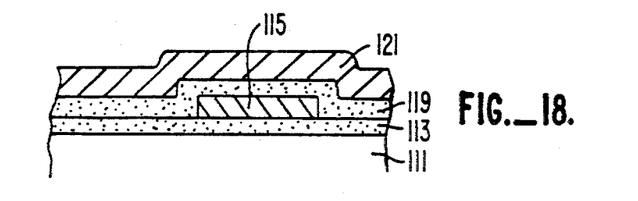

The polysilicon layer 115 is representative of a floating gate in the EEprom processing embodiments described above. After the oxide layer 119 of uniform thickness is formed, another doped polysilicon layer 121 is deposited over it to serve as a control gate (FIG. 18).

Figure 19:
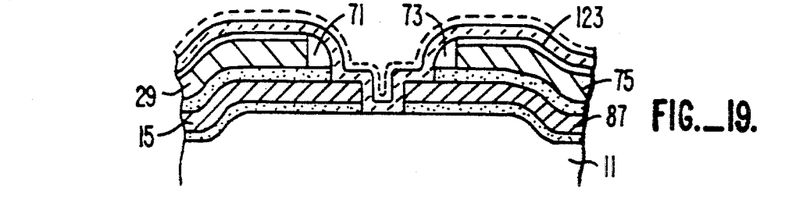
FIGS. 19 and 20 illustrate a specific application of the technique shown by FIGS. 15-18, FIGS. 21-23 show sequential processing steps employed in an alternative technique for forming diffused regions in the substrate.
Figure 20:
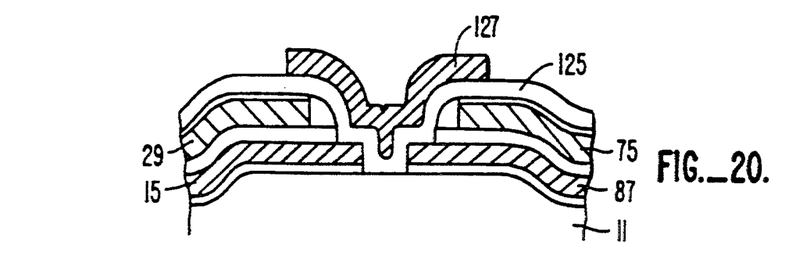

FIG. 19 illustrates the process described with respect to FIGS. 15-18 being applied to form the erase gate oxide. FIG. 19 corresponds to FIG. 11 before its erase oxide layers 45 and 93 are formed. Rather than oxidizing the exposed edges of the floating gates 15 and 87 directly, as is done in the embodiment of FIG. 11, a layer 123 of undoped polysilicon is deposited over the entire surface, in a manner described previously. This polysilicon layer, if sufficiently thin (i.e. 500 Angstrom or less), follows the asperities in the surface of the exposed floating gate edges. The layer 123 then has an oxide layer grown over it until it is substantially entirely consumed, at which time it is converted into a thicker oxide layer 125, as shown in FIG. 20. An erase gate 127 is then formed over the oxide layer 125, resulting in higher quality erase oxide between the erase gate 127 and edges of the floating gates 15 and 87.

Process of Forming Diffused Regions

Figure 21:
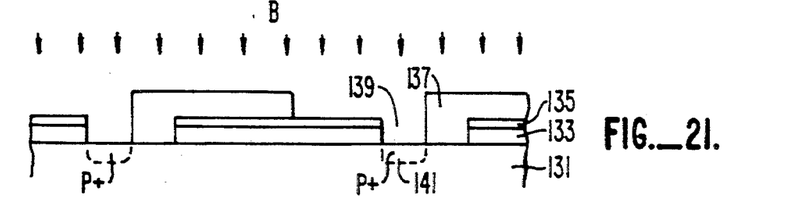
Figure 22:
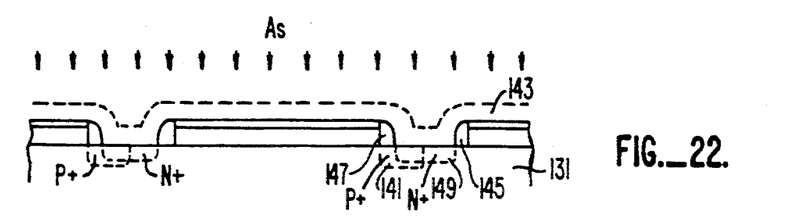
Figure 23:
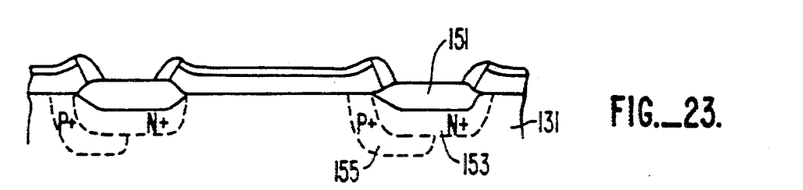

FIGS. 21-23 show several process steps, as an for forming the heavily n-doped source/drain regions and relatively heavily p-doped channel region. The process illustrated in FIGS. 21-23 is also an improvement over that illustrated in the process steps of FIG. 14 of the aforementioned patent application Ser. No. 204,117.

Referring to FIG. 21, a semiconductor substrate 131 has a nitride mask layer 133 with an etch stop thin oxide layer 135 over it. Openings in the nitride mask 133 are partially, temporarily covered by photoresist material 137 in order to form a restricted opening 139. A relatively heavily p-doped region 141 is formed in the substrate by ion implantation of boron through the opening 139. So far, the process is much the same as that described earlier with respect to FIGS. 3A and 3B.

However, as shown in FIG. 22, instead of performing the next implantation step through the entire width of the apertures in the nitride mask 133, those apertures are first restricted in width. This is accomplished by depositing a nitride layer 143 over the structure, after the photoresist layer 137 has been removed. The layer 143 is then etched by an anisotropic reactive ion etch process in a manner to leave spacers 145 and 147 along the edges of the nitride mask 133 at its openings. The relatively heavily n-doped region 149 is then formed in the substrate 141 by ion implantation of arsenic. It will be noted that the heavily p-doped region 141 is laterally displaced from an edge of the heavily n-doped region 149, before those regions are diffused into the wafer by heating. Thus, the position and size of the region 141 can be better controlled, without having to rely entirely on the inherent differential diffusion rate of the p- and n-regions, as with the process of FIGS. 3-5. (Relatively heavily doped region 141 is typically a doping concentration of around $1 \times 10^{17}$ cm$^{-3}$ while heavily doped region 149 is typically of doping concentration of around $1 \times 10^{20}$ cm$^{-3}$). The spacer 147 protects the surface of the substrate 131 under it, which has been implanted with impurities of a first polarity, from being overcompensated during the step of implanting impurities of a second polarity.

FIG. 23 shows a next step of growing a thick oxide layer 151 in the surface of the silicon substrate 131 in the openings in the nitride mask 133 between the spacers 145 and 147. At the same time, the heating causes expansion of the implanted regions, resulting in a heavy n-type region 153 and a relatively heavy p-type region 155. By oxidizing through the aperture restricted by the spacers 145 and 147, the width of the thick oxide 151 is smaller than before, thus allowing a smaller device to be constructed. After the process step illustrated in FIG. 23 is accomplished, the nitride mask 133 is removed and processing continues as previously described with respect to FIGS. 6-12.

Alternate Technique for Forming Floating Gates

In the process previously described, a continuous conductive polysilicon strip was separated into individual floating gates by an etching process, as described with respect to FIGS. 9 and 10. An alternate technique that has some advantages in certain circumstances is explained with respect to FIGS. 24 and 25. Instead of etching the polysilicon strip into its individual floating gates, oxide is grown over exposed polysilicon until the entire thickness of the polysilicon is consumed by the oxidation process.

Figure 24:
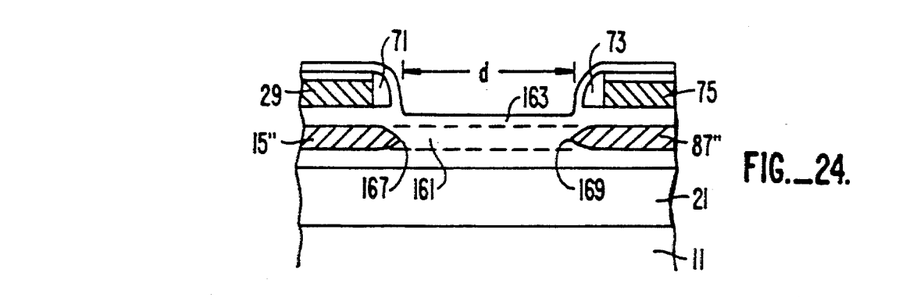
FIGS. 24 and 25 illustrate an alternative technique for separating a polysilicon strip into individual floating gates.

Referring to FIG. 24, an enlarged representation of FIGS. 9 and 10 is provided, with the same reference numbers applied to those elements which are the same. The continuous doped polysilicon strip is separated into adjoining floating gates 15" and 87" by oxidizing the polysilicon strip exposed between the spacers 71 and 73 until its portion 161 is totally consumed by the oxidation process. The result is an oxide layer 163, over which a conductive layer 165 may be formed as the erase gate.

Figure 25:
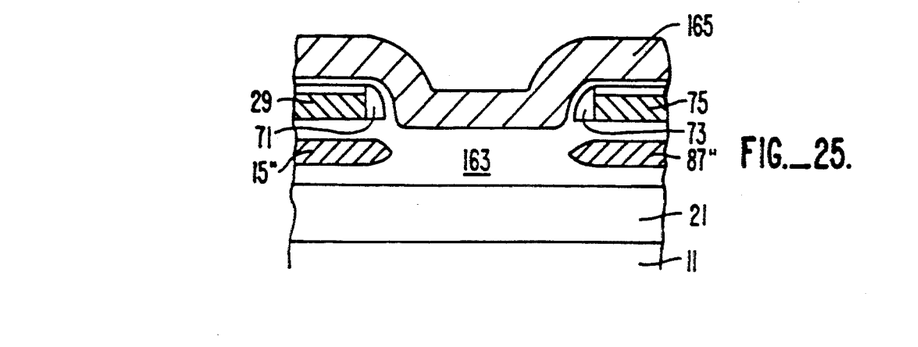

A result of this technique is the shaping of edges of the floating gates to a narrow line or point, such as that indicated at 167 and 169. This point aids in proper coupling between the floating gates and the erase gate on the opposite side of the erase gate being formed. This is an improved technique for forming the pointed floating gate illustrated in FIG. 16b of the aforementioned patent application Ser. No. 204,175.

In addition to the advantage of the resulting pointed floating gate edges, the process described with respect to FIGS. 24 and 25 also allows the thick oxide layer 21 to be made thinner, and perhaps even eliminated completely, since the etching of the polysilicon to form floating gates (which may also result in etching of any areas of exposed silicon substrate 11) is replaced by an oxidation step.

Mask Formation of Floating Gate Edges

Figure 26:
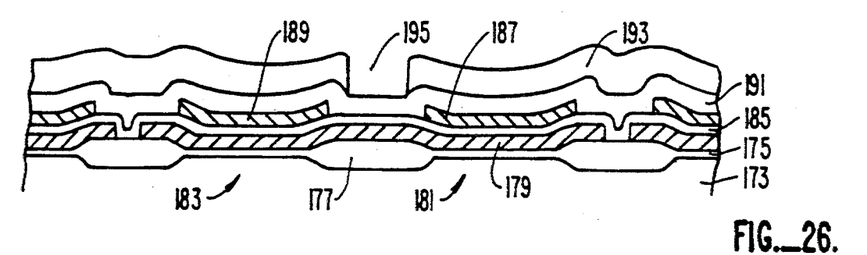
FIGS. 26-29 show an alternative process for forming individual floating gates.

As an alternative to the embodiment described with respect to FIGS. 8-12, FIGS. 26-29 illustrate another sequence of processing steps. Referring initially to FIG. 26, a substrate 173 has formed on its surface an oxide layer 175 with alternate thin and thick stripes thereacross, including a thick oxide portion 177. Immediately on top of this oxide layer is a strip 179 of conductive polysilicon material that is to be formed into individual floating gates. Rather than initially extending this strip substantially completely across an array of many memory cells, the doped polysilicon strip 129 is formed by a mask that limits its length to extend across only two adjacent memory cells being formed, in this case cells 181 and 83. A subsequent series of processing steps, to be described, then separate the strip 179 into two individual, adjacent floating gates with an erase gate between them and coupled with both.

The starting structure of FIG. 26 also includes a thin control gate oxide layer 185, and a series of parallel control gate strips extending with their length and their direction perpendicular to the paper, such as control gates 187 and 189 for the cells 181 and 183, respectively. On top of the control gates, and the rest of the structure is then formed an oxide layer 191. The structure thus described with respect to FIG. 26 is similar to that of FIG. 7B, in the prior embodiment, with the primary difference that the polysilicon strip which is to be used to form individual floating gates extends across only two adjacent memory cells.

Figure 27:
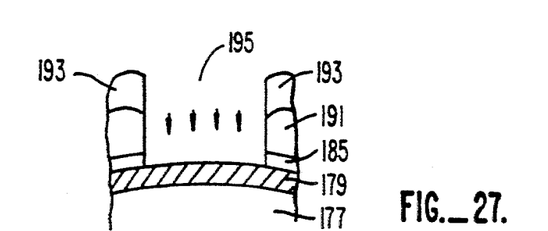
Figure 28:
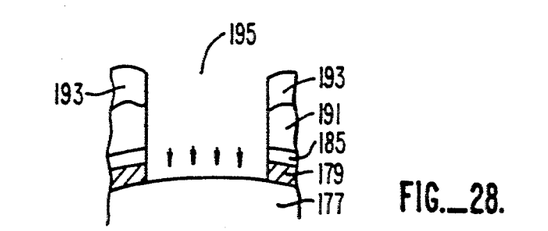

In order to separate the strip 179 into two floating gate portions, a photoresist mask 193 is formed on top of the structure with an opening 195 therein positioned by a photographic mask. Three different etching steps are then performed in sequence to operate on the structure that is accessible through the opening 195. The first of these etching steps, illustrated in FIG. 27 is an anisotropic dry etch of the oxide layer 185, 191. Of course, the opening in the oxide layer then conforms substantially to that of the opening 195 in the photoresist layer 193. The second etch, illustrated by FIG. 28 is an anisotropic etch of the polysilicon layer 179 to separate it into floating gates for the adjacent memory cells 181 and 183 that are separated from each other. The type of etch employed selectively operates upon the doped polysilicon material at a much faster rate than on oxide, so the exposed oxide layers are substantially unaffected.

Figure 29:
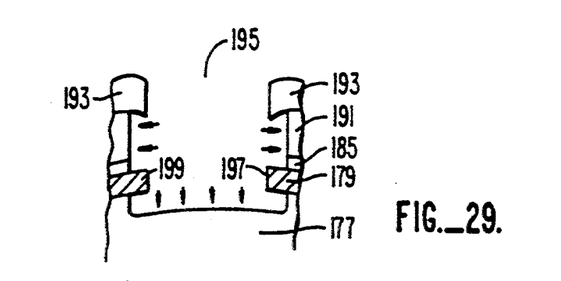

The third of the etching steps is illustrated in FIG. 29, and is a short isotropic wet etch that moves the sidewalls of the exposed oxide layer 191, 185 back under the photoresist 193. At the same time, the thick field oxide portion 177 is vertically etched and laterally etched under the floating gates. The result is the clean exposure of edges 197 and 199 of adjacent floating gates.

Once these floating gate edges are exposed, the photoresist material 193 is removed and an erase gate oxide layer is grown on the exposed floating gate portions 197 and 199, in a manner described previously with respect to other embodiments. After that, an erase gate is formed by depositing conductive material, usually doped polysilicon, in the opening formed by the etch and isolated from the floating gate edges 197 and 199 by only the grown erase gate oxide. Because the isotropic wet etch step illustrated in FIG. 29 allows good control of the amount of the floating gate edges 197 and 199 that are exposed, the area of coupling between these floating gates and the subsequently formed erase gate can be carefully controlled. Because of this control, erase gates need not be provided on opposite sides of each floating gate, as done in other EEprom processes as compensation for potential misalignment between the erase gates and the floating gates within the tolerance of photographic mask alignment. Indeed, although two erase gates are shown coupled to each of the floating gates in the embodiment described with respect to FIGS. 1-14, the good control of coupling area between its floating gates and erase gates also allow every other erase gate shown in those figures to be eliminated, if desired.

In the process embodiment of FIGS. 26-29, the exposed polysilicon floating gate material is etched away. However, the process there described can be altered to separate the polysilicon strip 179 into two floating gates by the oxidation process earlier described with respect to FIGS. 24 and 25.

Although the various aspects of the present invention have been described with respect to its preferred embodiments, it will be understood that the invention is entitled to protection within the full scope of the appended claims.

It is claimed:

1. A method of forming a two dimensional array of flash electrically erasable and programmable read only memory cells on a semiconductor substrate, comprising the steps of:

forming a first plurality of continuous elongated parallel strips of conductive material on said substrate in a manner to be insulated therefrom by a first dielectric layer, forming a second plurality of continuous elongated parallel strips of conductive material on said substrate and over said first plurality of conductive strips in a manner to be insulated therefrom by a second dielectric layer, said first and second plurality of strips having their lengths oriented substantially orthogonal to each other, thereafter forming spacers along opposing edges of adjacent ones of said second plurality of parallel strips and extending toward each other but leaving a defined space therebetween, and thereafter forming a gap in said first plurality of strips through the space defined by the spacers, thereby forming electrically isolated floating gates from said first plurality of strips.

2. The method according to claim 1 wherein the step of forming a gap in said first plurality of strips includes applying an etchant to said first plurality of strips in a region defined by said spacers.

3. The method according to claim 1 wherein the step of forming a gap in said first plurality of strips includes the step of oxidizing said first plurality of strips in a region defined by said spacers.

4. The method according to claim 1 which additionally comprises, after the first conductive strips have been separated into electrically isolated floating gates, the additional steps of forming asperities adjacent edges of said floating gates, and forming a third dielectric layer thereover.

5. The method according to claim 3 wherein the step of forming a dielectric of said floating gates includes:

forming a layer of an undoped polysilicon material of a substantially uniform thickness across said semiconductor structure, and thereafter growing a layer of oxide on the undoped polysilicon material layer for a time until substantially the entire undoped polysilicon material layer has been consumed and made part of the grown oxide layer.

6. The method according to claim 1 wherein said second dielectric layer is formed by the steps of:

forming a layer of an undoped polysilicon material of a substantially uniform thickness across said semiconductor structure, and thereafter growing a layer of oxide on the undoped polysilicon material layer for a time until substantially the entire undoped polysilicon material layer has been consumed and made part of the grown oxide layer.

7. A method of forming a two dimensional array of flash electrically erasable and programmable read only memory cells on a semiconductor substrate, comprising the steps of:

forming a first plurality of continuous elongated parallel strips of conductive material on said substrate in a manner to be insulated therefrom by a first dielectric layer, including depositing doped polysilicon by low pressure chemical vapor deposition at a temperature in excess of 620 degrees centigrade, forming a second plurality of continuous elongated parallel strips of conductive material on said substrate and over said first plurality of conductive strips in a manner to be insulated therefrom by a second dielectric layer, said first and second plurality of strips having their lengths oriented substantially orthogonal to each other, wherein the step of forming the second plurality of elongated strips includes depositing doped polysilicon by low pressure chemical vapor deposition at a temperature less than 600 degrees centigrade, thereafter forming spacers along opposing edges of adjacent ones of said second plurality of parallel strips and extending toward each other but leaving a defined space therebetween, and thereafter performing an operation on said first plurality of strips through the space defined by the spacers.

8. A method of forming a two dimensional array of flash electrically erasable and programmable read only memory cells on a semiconductor substrate, comprising the steps of:

(a) implanting dopant of opposite polarity in adjacent regions of a semiconductor substrate, by a method comprising the steps of:

forming a first masking layer over said substrate which has a plurality of apertures therein, providing a second mask over said first masking layer in a manner to cover a portion of said apertures from one side thereof, thereby leaving a first restricted opening to said substrate adjacent an opposite side of said apertures, performing a first implant of impurities of a first polarity through said first restricted opening, removing said second mask while maintaining said first masking layer in place, forming a spacer within said apertures at least along said opposite side thereof, thereby forming a second restricted opening therethrough, and providing a second implant of a second polarity opposite to said first polarity through said second restricted opening, whereby said spacer protects the surface of said semiconductor substrate which is implanted with impurities of the first polarity from over compensation from the second implant of said opposite polarity, (b) thereafter forming a first plurality of continuous elongated parallel strips of conductive material on said substrate in a manner to be insulated therefrom by a first dielectric layer, (c) thereafter forming a second plurality of continuous elongated parallel strips of conductive material on said substrate and over said first plurality of conductive strips in a manner to be insulated therefrom by a second dielectric layer, said first and second plurality of strips having their lengths oriented substantially orthogonal to each other, (d) thereafter forming spacers along opposing edges of adjacent ones of said second plurality of parallel strips and extending toward each other but leaving a defined space therebetween, and (e) thereafter performing an operation on said first plurality of strips through the space defined by the spacers.

9. A method of forming a two dimensional array of flash electrically erasable and programmable read only memory cells on a semiconductor substrate, comprising the steps of:

forming a first plurality of elongated parallel strips of conductive material on said substrate in a manner to be insulated therefrom by a first dielectric layer, forming a second plurality of elongated parallel strips of conductive material on said substrate and over said first plurality of conductive strips in a manner to be insulated therefrom by a second dielectric layer, said first and second plurality of strips having their lengths oriented substantially orthogonal to each other, thereby to form control gates, forming spacers of dielectric material along opposing edges of said control gates and extending toward each other with a gap of a predetermined width remaining therebetween that exposes portions of said first plurality of strips therein, etching away said exposed portions of said first plurality of strips, thereby forming isolated floating gates extending between etched spaces therebetween, thereafter reducing the size of the spacers in a manner to expand said gap, thereby exposing surface area portions of said floating gates adjacent said spacers, forming a third dielectric layer over the exposed surface area of the floating gates, and forming a third plurality of elongated parallel strips of conductive material across said third dielectric, thereby to form erase gates.

10. A method of forming a two dimensional array of flash electrically erasable and programmable read only memory cells on a semiconductor substrate, comprising the steps of:

forming a first plurality of elongated parallel strips of conductive material on said substrate in a manner to be insulated therefrom by a first dielectric layer, forming a second plurality of elongated parallel strips of conductive material on said substrate and over said first plurality of conductive strips in a manner to be insulated therefrom by a second dielectric layer, said first and second plurality of strips having their lengths oriented substantially orthogonal to each other, thereby to form control gates, forming spacers of dielectric material along opposing edges of said control gates and extending toward each other with a gap of a predetermined width remaining therebetween that exposes portions of said first plurality of strips therein, said spacer forming step including forming first and second spacer portions in time sequence adjacent each other, the material of said first spacer portion exhibiting a significantly slower response to a given etching process than the material of said second spacer portion, etching away said exposed portions of said first plurality of strips, thereby forming isolated floating gates extending between etched spaces therebetween, thereafter reducing the size of the spacers in a manner to expand said gap, thereby exposing surface area portions of said floating gates adjacent said spacers, said spacer reducing step including the step of removing said second spacer portion by said given etching process, forming a third dielectric layer over the exposed surface area of the floating gates, and forming a third plurality of elongated parallel strips of conductive material across said third dielectric, thereby to form erase gates.

11. The method according to claim 10 wherein said first spacer portion is formed of densified undoped silicon dioxide, said second spacer portion is formed of silicon dioxide doped with phosphorus, and said given etching process is a wet etch.

12. The method according to claim 9 wherein the step of forming the spacers includes forming a single spacer portion, and further wherein the step of reducing the size of the spacers includes the step of etching said single spacer portion in a manner to reduce its size.

13. A method of forming a two dimensional array of flash electrically erasable and programmable read only memory cells on a semiconductor substrate, comprising the steps of:

forming a first plurality of elongated parallel strips of conductive material on said substrate in a manner to be insulated therefrom by a first dielectric layer, forming a second plurality of elongated parallel strips of conductive material on said substrate and over said first plurality of conductive strips in a manner to be insulated therefrom by a second dielectric layer, said first and second plurality of strips having their lengths oriented substantially orthogonal to each other, thereby to form control gates, forming spacers of dielectric material along opposing edges of said control gates and extending toward each other with a gap of a predetermined width remaining therebetween that exposes portions of said first plurality of strips therein, etching away said exposed portions of said first plurality of strips, thereby forming isolated floating gates extending between etched spaces therebetween, thereafter reducing the size of the spacers in a manner to expand said gap, thereby exposing surface area portions of said floating gates adjacent said spacers, forming a third dielectric layer over the exposed surface area of the floating gates, forming a third plurality of elongated parallel strips of conductive material across said third dielectric, thereby to form erase gates, and forming a fourth layer of dielectric over the control gates before the erase gates are formed, thereby isolating said control and erase gates.

14. The method according to claim 13 wherein said second, third and fourth dielectric layers are formed in separate steps, whereby each of these dielectric layers may be optimized to perform specific functions required of it.

15. The method according to claim 9 wherein the step of forming a third plurality of elongated strips of conductive material includes forming them in a direction substantially parallel to said control gates.

16. A method of forming a two dimensional array of flash electrically erasable and programmable read only memory cells on a semiconductor substrate, comprising the steps of:

forming a first plurality of elongated parallel strips of conductive material on said substrate in a manner to be insulated therefrom by a first dielectric layer, including depositing doped polysilicon by low pressure chemical vapor deposition at a temperature in excess of 620 degrees centigrade, forming a second plurality of elongated parallel strips of conductive material on said substrate and over said first plurality of conductive strips in a manner to be insulated therefrom by a second dielectric layer, said first and second plurality of strips having their lengths oriented substantially orthogonal to each other, thereby to form control gates, wherein the step of forming the second plurality of elongated strips includes depositing doped polysilicon by low pressure chemical vapor deposition at a temperature less than 600 degrees centigrade, forming spacers of dielectric material along opposing edges of said control gates and extending toward each other with a gap of a predetermined width remaining therebetween that exposes portions of said first plurality of strips therein, etching away said exposed portions of said first plurality of strips, thereby forming isolated floating gates extending between etched spaces therebetween, thereafter reducing the size of the spacers in a manner to expand said gap, thereby exposing surface area portions of said floating gates adjacent said spacers, forming a third dielectric layer over the exposes surface area of the floating gates, and forming a third plurality of elongated parallel strips of conductive material across said third dielectric, thereby to form erase gates.

17. A method of forming a plurality of flash electrically erasable and programmable read only memory cells on a semiconductor substrate, comprising the steps of:

forming a first layer of doped polysilicon conductive material across two adjacent of said memory cells and insulated from said substrate by first dielectric layer, forming a second dielectric layer over said first polysilicon layer, forming a second layer of doped polysilicon conductive material as a control gate over each of said adjacent memory cells, forming a third dielectric layer across said control gate and exposed portions of said second dielectric layer therebetween, forming a mask over said third dielectric layer with an aperture therein positioned between the adjacent cells but over the first polysilicon layer extending therebetween, removing the third dielectric layer and said first doped polysilicon layer under the aperture of said photoresist mask by subjecting them to an anisotropic etch, thereby separating the first doped polysilicon layer into a separate floating gate for each of said at least two adjacent cells and to leave a well in the structure under said aperture, thereafter partially etching said third dielectric layer exposed through said photoresist mask aperture by an isotropic etch, thereby moving vertical dielectric walls away from the region under said photoresist aperture to leave edges of the separated first doped polysilicon layer extending beyond said vertical dielectric walls and into said well, stripping said mask from said third dielectric layer, forming a fourth dielectric layer over the exposed polysilicon floating gates in said well, and forming an erase gate in said well in a manner that the fourth dielectric layer separates said erase gate from each of the separated first polysilicon layer floating gates.

18. The method according to claim 17 wherein any of said first, second or fourth dielectric layers is formed by the steps of:

forming a layer of an undoped polysilicon material of a substantially uniform thickness across said semiconductor structure, and thereafter growing a layer of oxide on the undoped polysilicon material layer for a time until substantially the entire undoped polysilicon material layer has been consumed and made part of the grown oxide layer.

19. The method according to claim 17 wherein the step of forming a first polysilicon layer includes depositing doped polysilicon by low pressure chemical vapor deposition at a temperature in excess of 620 degrees centigrade, and further wherein the step of forming the second polysilicon layer includes depositing doped polysilicon by low pressure chemical vapor deposition at a temperature less than 600 degrees centigrade.

20. The method according to claim 17 which, prior to forming either of said first and second doped polysilicon layers, additionally comprises implanting dopant of a first polarity in adjacent regions of the semiconductor substrate, by a method comprising the steps of:

forming a first masking layer over said substrate which has a plurality of apertures therein, providing a second mask over said first masking layer in a manner to cover a portion of said apertures from one side thereof, thereby leaving a first restricted opening to said substrate adjacent an opposite side of said apertures, performing a first implant of impurities of a first polarity through said first restricted opening, removing said second mask while maintaining said first masking layer in place, forming a spacer within said apertures at least along said opposite side thereof, thereby forming a second restricted opening therethrough, and providing a second implant of a second polarity opposite to said first polarity through said second restricted opening, whereby said spacer protects the surface of said semiconductor substrate implanted with said impurities of the first polarity from overcompensation from said second implant of the opposite second polarity.

21. A method of forming a plurality of flash electrically erasable and programmable read only memory cells on a semiconductor substrate, comprising the steps of:

forming a first layer of doped polysilicon conductive material across two adjacent of said memory cells and insulated from said substrate by first dielectric layer, forming a second dielectric layer over said first polysilicon layer, forming a second layer of doped polysilicon conductive material as a control gate over each of said adjacent memory cells, forming a third dielectric layer across said control gate and exposed portions of said second dielectric layer therebetween, forming a mask over said third dielectric layer with an aperture therein positioned between the adjacent cells but over the first polysilicon layer extending therebetween, removing the third dielectric layer under the aperture of said photoresist mask, thereby exposing said first polysilicon layer, growing oxide through the mask aperture on the first polysilicon layer in a manner that the first polysilicon layer is completely consumed, thereby separating the first doped polysilicon layer into a separate floating gate for each of said at least two adjacent cells, and forming an erase gate through said mask aperture.

22. A method of forming a layer of oxide on a doped polysilicon conductor that is an electrically isolated floating gate provided as part of an integrated circuit, including the steps of:

forming a layer of an undoped polysilicon material on said doped polysilicon surface, thereafter growing a layer of oxide on the undoped polysilicon material layer for a time until substantially the entire undoped polysilicon material layer has been consumed and made part of the grown oxide layer, and forming a conductive erase gate over at least a portion of said grown oxide layer.

23. A method of forming an array of memory cells on a semiconductor substrate, comprising:

forming a thin layer of gate oxide insulating material across said substrate, forming a first set of substantially parallel strips of doped polysilicon material across said oxide in order to form a first set of elongated electrically conductive strips thereacross, thereafter forming a layer of undoped polysilicon material extending over top surfaces of said gate oxide and said doped polysilicon material strips, thereafter growing a layer of oxide on the undoped polysilicon material layer for a time until substantially the entire undoped polysilicon material layer has been consumed and made part of the grown oxide layer, thereafter forming a second set of substantially parallel strips of doped polysilicon material across said layer of grown oxide in order to form a second set of elongated electrically conductive strips thereacross, said first and second sets of conductive strips having their lengths oriented substantially orthogonal to each other, and thereafter removing portions of said first set of conductive strips between said second set of conductive strips, thereby forming a plurality of electrically isolated gates along the length of each of said first set of conductive strips.

24. A method of forming an electrically erasable and programmable read only memory having a doped polysilicon floating gate separate from a semiconductor substrate and from a doped polysilicon control gate by oxide insulating layers, and an erase gate separated from a portion of said floating gate by an erase oxide, comprising the steps of:
   depositing said floating gate polysilicon layer in excess of 620° C.,
   growing said erase gate oxide over a portion of the surface of said floating gate polysilicon layer,
   depositing said control gate polysilicon layer by a temperature of less than 600° C.,
   growing an insulating oxide layer over said control gate polysilicon layer, and
   forming a conductive erase gate in a position to be separated from said floating gate by said erase gate oxide and from said control gate by said insulating oxide layer.

25. A method of implanting dopant of opposite conductivity type in adjacent regions of a semiconductor substrate, comprising the steps of:
   forming a first masking layer over said substrate which has a plurality of apertures therein,
   providing a second mask over said first masking layer in a manner to cover a portion of said apertures from one side thereof, thereby leaving a first restricted opening to said substrate adjacent an opposite side of said apertures,
   performing a first implant of impurities of a first polarity through said first restricted opening,
   removing said second mask while maintaining said first masking layer in place,
   forming a spacer within said apertures at least along said opposite side thereof, thereby forming a second restricted opening therethrough, and
   providing a second implant of a second polarity opposite to said first polarity through said second restricted opening,
   whereby said spacer protects the surface of said semiconductor substrate implanted with impurities of the first polarity from overcompensation from said second implant of the opposite second polarity.

26. The method according to claim 25 which comprises an additional step of thereafter growing a layer of thick oxide in said substrate through said second restricted opening.

27. A method of forming an array of a plurality of memory cells on a semiconductor substrate, comprising the steps of:
   forming a doped polysilicon strip extending across at least two adjacent memory cells and insulated from said substrate by a thin insulating layer therebetween,
   protecting the polysilicon strip by a mask that leaves a portion thereof between said at least two cells exposed, and
   oxidizing said exposed doped polysilicon until the exposed portion is completely consumed by the oxidation process, thereby leaving electrically separate floating gates associated with each of said adjacent cells.

28. The method according to claim 27 wherein said mask is provided, at least in part, by a patterned layer of doped polysilicon in each of said adjacent cells positioned over said polysilicon strip with an insulating layer therebetween.

29. The method according to claim 27 wherein said exposed polysilicon strip portion is defined by an aperture in a photoresist mask.

30. The method according to claim 1 which comprises the following additional steps performed after the electrically isolated floating gates have been formed:
   reducing the size of the spacers in a manner to expand said gap, thereby exposing surface area portions of said floating gates adjacent said spacers,
   forming a third dielectric layer over the exposed surface area of the floating gates, and
   forming a third plurality of elongated strips of conductive material across said third dielectric layer within at least a portion of said expanded gap and in a manner to be substantially parallel with each other and with said second plurality of conductive strips, thereby forming erase gates.

* * * * *